United States Patent
Ritter et al.

(10) Patent No.: US 9,412,496 B2
(45) Date of Patent: Aug. 9, 2016

(54) CABLE ASSEMBLY FOR A CABLE BACKPLANE SYSTEM

(71) Applicant: Tyco Electronics Corporation, Berwyn, PA (US)

(72) Inventors: Christopher David Ritter, Hummelstown, PA (US); Jeffrey Stewart Simpson, Mechanicsburg, PA (US); Tracy Lee Smith, Harrisburg, PA (US); Brian Patrick Costello, Scotts Valley, CA (US); Jared Evan Rossman, Dover, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 285 days.

(21) Appl. No.: 14/063,631

(22) Filed: Oct. 25, 2013

(65) Prior Publication Data

US 2015/0116976 A1    Apr. 30, 2015

(51) Int. Cl.
| | |
|---|---|
| *H01B 7/28* | (2006.01) |
| *H05K 7/14* | (2006.01) |
| *H04Q 1/02* | (2006.01) |
| *H04Q 1/06* | (2006.01) |

(52) U.S. Cl.
CPC ............ *H01B 7/2813* (2013.01); *H04Q 1/06* (2013.01); *H04Q 1/116* (2013.01); *H05K 7/1491* (2013.01)

(58) Field of Classification Search
CPC ... H05K 7/1459; H01B 7/0045; H01B 7/2813
USPC .................... 361/826, 829; 211/26
See application file for complete search history.

(56) References Cited

U.S. PATENT DOCUMENTS

| | | | | |
|---|---|---|---|---|
| 6,269,000 | B1 * | 7/2001 | McCarrol | H02B 1/202 361/695 |
| 6,809,258 | B1 * | 10/2004 | Dang | H02G 15/117 174/50 |
| 2005/0264472 | A1 * | 12/2005 | Rast | G09G 3/14 345/30 |
| 2014/0360752 | A1 * | 12/2014 | Sechrist | H05K 7/1491 174/79 |
| 2014/0360753 | A1 * | 12/2014 | Sechrist | H05K 7/1449 174/79 |
| 2014/0362546 | A1 * | 12/2014 | Sechrist | H05K 7/1447 361/752 |
| 2014/0362549 | A1 * | 12/2014 | Sechrist | H05K 7/1449 361/758 |
| 2015/0029675 | A1 * | 1/2015 | Rossman | H05K 7/1447 361/726 |

(Continued)

OTHER PUBLICATIONS

TE Connectivity, IDC D-SUB Connectors, Jan. 17, 2012, TE Connectivity.*

(Continued)

*Primary Examiner* — Zachary M Pape
*Assistant Examiner* — Amir Jalali

(57) ABSTRACT

A cable assembly for a cable backplane system includes a tray having a frame and spacer assemblies coupled to the frame that hold cable tray connectors in fixed positions relative to the frame. Each cable tray connector has a housing holding a plurality of contacts and cables extending rearward from the corresponding housing. The housings are configured to be received in corresponding openings in a backplane of the cable backplane system. A flexible cable harness extends from the tray. The flexible cable harness has a flexible shield electrically coupled to the frame and a harness connector electrically connected to at least one corresponding cable tray connector. At least some of the cables are routed from the tray through the flexible shield to the harness connector. The flexible shield provides electrical shielding for the cables. The harness connector is variably positionable relative to the tray.

20 Claims, 7 Drawing Sheets

(56) References Cited

U.S. PATENT DOCUMENTS

| | | | | |
|---|---|---|---|---|
| 2015/0029676 A1* | 1/2015 | Nichols | | H05K 7/1491 361/727 |
| 2015/0034356 A1* | 2/2015 | Ritter | | H04Q 1/14 174/79 |
| 2015/0075856 A1* | 3/2015 | Ritter | | H05K 1/11 174/261 |
| 2015/0111421 A1* | 4/2015 | Rossman | | H01R 13/73 439/527 |
| 2015/0114708 A1* | 4/2015 | Rossman | | H01R 13/648 174/350 |
| 2015/0116976 A1* | 4/2015 | Ritter | | G06F 13/4022 361/826 |
| 2015/0129287 A1* | 5/2015 | Ritter | | H04Q 1/02 174/255 |
| 2015/0163950 A1* | 6/2015 | Sechrist | | H05K 7/1449 361/788 |
| 2015/0163951 A1* | 6/2015 | Rossman | | H05K 7/1449 361/788 |
| 2015/0163952 A1* | 6/2015 | Rossman | | H05K 7/1449 361/788 |

OTHER PUBLICATIONS

Docooler, Docooler OBD2 Splitter Extension cabel, Apr. 3, 2010, Docooler.*

Hitachi cable Manchester, SCSI-LITE, Apr. 4, 2014, Hitachi cable manchester.*

* cited by examiner

CABLE ASSEMBLY FOR A CABLE BACKPLANE SYSTEM

BACKGROUND OF THE INVENTION

The subject matter herein relates generally to cable assemblies for a cable backplane system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. However, packaging of large numbers of cable assemblies is difficult. Cable management is a limiting factor in such systems. Current cabled tray designs utilize a dense cabled structure that is difficult to assemble due to weight and size constraints. Additionally current cabled tray designs do not allow end users to configure the trays to meet with different system architectures. The cabled trays have one pre-specified configuration and the connectors held by the cabled tray are all fixed relative to one another. Due to such constraints, the density per linear inch of differential pairs of contacts held by the connectors of the cable assemblies may be negatively impacted, and therefor the system architecture can be negatively impacted. For example, less space may be available for other hardware components within the system, such as power supplies, system airflow components, and the like.

A need remains for a cable backplane system having design flexibility for the end user.

BRIEF DESCRIPTION OF THE INVENTION

In one embodiment, a cable assembly is provided for a cable backplane system. The cable assembly includes a tray having a frame surrounding a raceway and spacer assemblies coupled to the frame. The spacer assemblies hold cable tray connectors in fixed positions relative to the frame. Each cable tray connector has a housing holding a plurality of contacts. Each cable tray connector has cables terminated to corresponding contacts and extending rearward from the corresponding housing into the raceway. The housings are configured to be received in corresponding openings in a backplane of the cable backplane system. A flexible cable harness extends from the tray. The flexible cable harness has a flexible shield electrically coupled to the frame. The flexible cable harness has a harness connector. At least some of the cables are routed from the raceway through the flexible shield to the harness connector. The flexible shield provides electrical shielding for the cables. The harness connector is variably positionable relative to the tray.

Optionally, the harness connector may be electrically connected to cables and contacts of at least two cable tray connectors. Optionally, the harness connector may be electrically connected to cables and contacts of each of the cable tray connectors. The harness connector may be coupled to a line card connector and the cable tray connectors may be connected to switch card connectors of a switch card.

Optionally, the flexible shield may entirely surround the cables from the tray to the harness connector to provide electrical shielding along the entire length of each cable. The housing may include a shell electrically coupled to the flexible shield to provide electrical shielding around the harness connector. The harness connector may include a plurality of harness contacts terminated to corresponding cables.

Optionally, the frame may include side walls and a rear wall defining a box-shaped raceway. The spacer assemblies may extend between the side walls to hold the cable tray connectors at a front edge of the tray for loading into corresponding openings in the backplane.

Optionally, the flexible cable harness may define a first flexible cable harness. The cable assembly may further include a second flexible cable harness extending from the tray having a flexible shield electrically coupled to the frame and a second harness connector. The second flexible cable harness may be independently movable relative to the first flexible cable harness. The flexible shields of the first and second flexible cable harnesses may have different lengths to position the harness connectors of the first and second flexible cable harnesses at different distances from the tray. The cable assembly may include a front panel having a plurality of openings. The harness connectors of the first and second flexible cable harnesses may be received in different openings in the panel and may be fixed in position relative to one another by the front panel. The front panel may be variably positionable relative to the tray.

In another embodiment, a cable backplane system is provided including a backplane having a plurality of openings therethrough and a cable rack coupled to a rear side of the backplane. The cable rack includes a plurality of cable assemblies each having a tray and a flexible cable harness extending from the tray. The tray has a frame surrounding a raceway. The tray holds cable tray connectors in fixed locations relative to one another. The cable tray connectors are received in corresponding openings in the backplane. Each cable tray connector has a plurality of cables extending therefrom that are routed in the raceway. The flexible cable harness has a harness connector being variably positionable relative to the tray. The harness connector is electrically connected to cables extending from corresponding cable tray connectors.

In a further embodiment, a cable backplane system is provided that includes a backplane having a plurality of openings therethrough and a cable rack coupled to a rear side of the backplane. The cable rack includes a plurality of cable assemblies each having a tray and a flexible cable harness extending from the tray. The tray has a frame surrounding a raceway and holds spacer assemblies with cable tray connectors held by corresponding spacer assemblies. Each cable tray connector has a plurality of cables extending therefrom that are routed in the raceway. The cable tray connectors are received in corresponding openings in the backplane. The flexible cable harness has a flexible shield electrically coupled to the frame. The flexible cable harness has a harness connector. The cables are routed from the raceway through the flexible shield to the harness connector. The flexible shield provides electrical shielding for the cables. The harness connector is variably positionable relative to the tray.

DETAILED DESCRIPTION OF THE INVENTION

Figure 1:
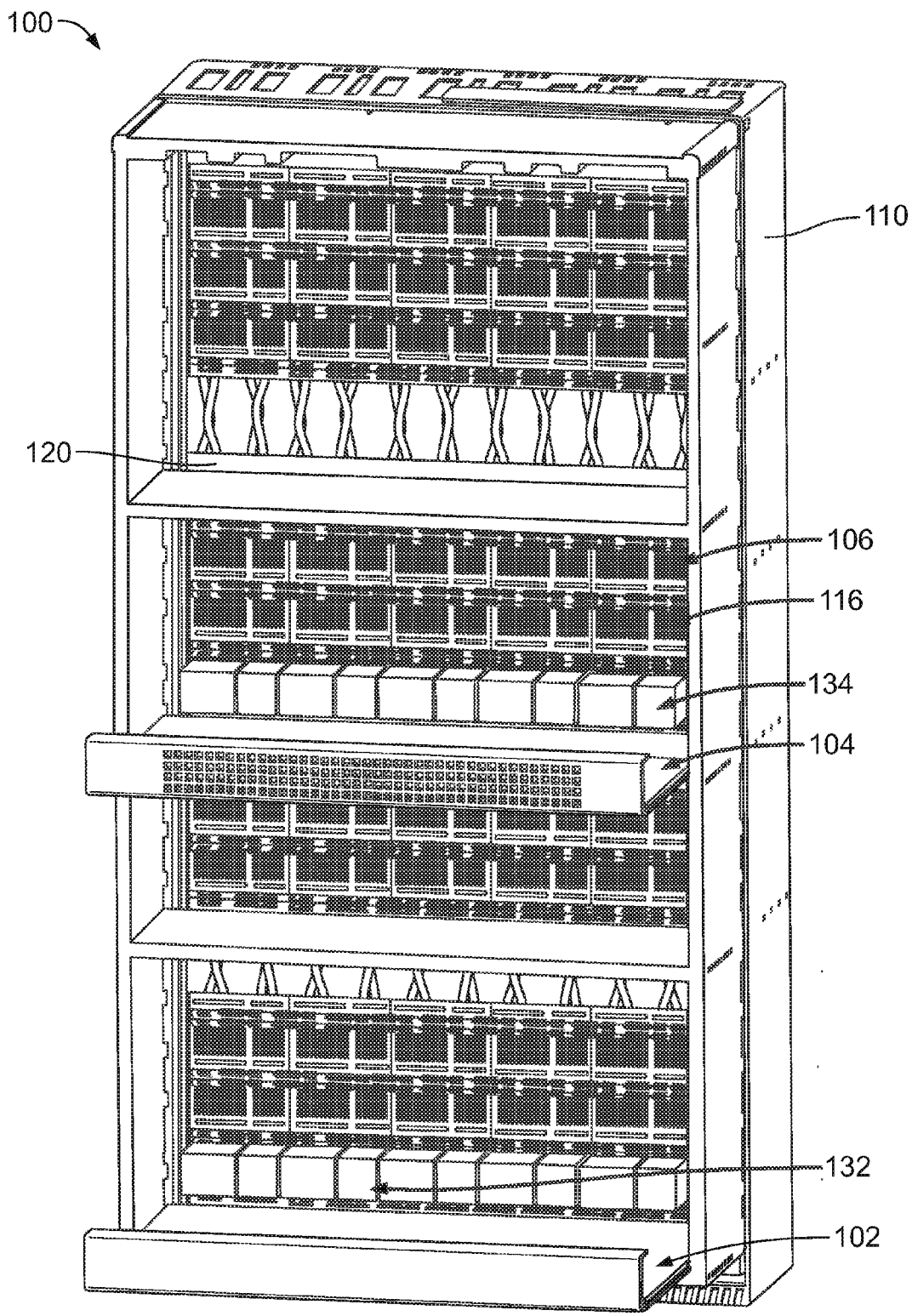
FIG. 1 is a front perspective view of a cable backplane system formed in accordance with an exemplary embodiment.
Figure 2:
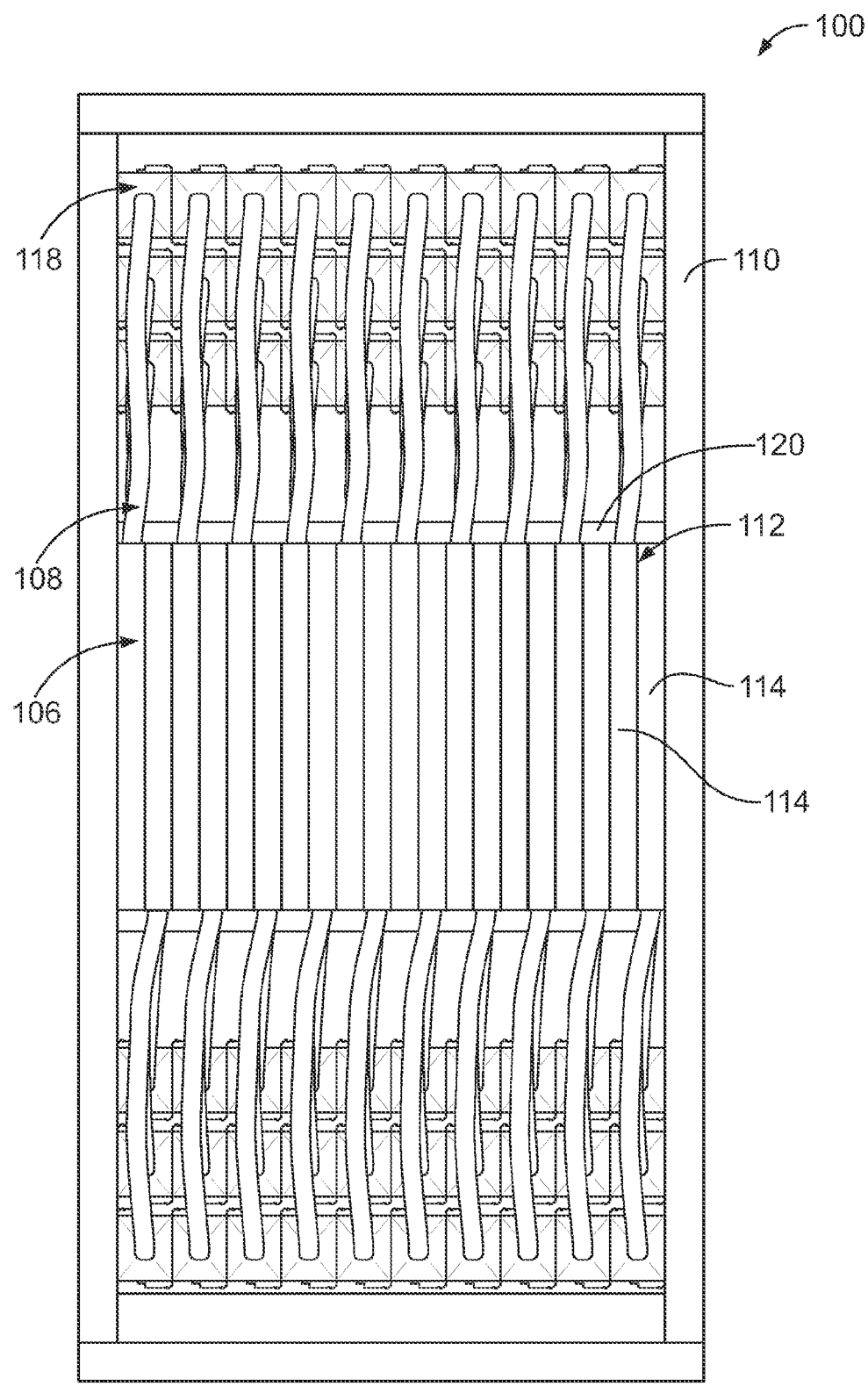
FIG. 2 is a rear view of the cable backplane system.

FIG. 1 is a front perspective view of a cable backplane system 100 formed in accordance with an exemplary embodiment. FIG. 2 is a rear view of the cable backplane system 100. The cable backplane system 100 is used in a data communication application, such as a network switch. The cable backplane system 100 interconnects line cards 102 and switch cards 104 using cable assemblies 106. For example, the cable assemblies 106 are connected to card connectors 132, 134 of the line and switch cards 102, 104, respectively. The cable backplane system 100 may be used to interconnect with other types of connectors and/or cards, such as daughtercards, in other embodiments.

The cable assemblies 106 include flexible cable harnesses 108 to form flexible sections that allow ease of use for the installer. The flexible cable harnesses 108 allow different configurations or placement of components of the cable backplane system 100. The flexible cable harnesses 108 allow the same cable assembly 106 design to fit in different types of systems or architectures, such as to fit different customer needs. The flexible cable harnesses 108 allow more space to implement other features or components within the cable backplane system 100, such as power modules, system airflow components, such as fans, and the like.

Each cable harness 108 includes a harness connector 118. The cable assemblies 106 also include cable tray connectors 116 that are interconnected with corresponding harness connectors 118 by cables within the cable backplane system 100. The cable assemblies 106 eliminate interconnections via traces of a circuit board, such as a backplane circuit board. The cable assemblies 106 have improved signal performance along the signal paths between various connectors of the cable backplane system 100 as compared to conventional backplanes. The cable assemblies 106 support higher speeds, longer signal path lengths and lower cost per channel as compared to conventional backplanes. The cable assemblies 106 provide shielding of signal lines for improved signal performance. The cable assemblies 106 are packaged in a structure that allows accurate cable and connector location of the cable tray connectors 116 while allowing flexible or independent positioning of the harness connectors 118 for design flexibility. Optionally, the harness connectors 118 may be connected to corresponding line cards 102 while the cable tray connectors 116 are connected to corresponding switch cards 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the line cards 102 and switch cards 104 coupled to the cable backplane system 100.

The cable backplane system 100 includes a plurality of the cable assemblies 106 that are coupled to the chassis 110, another structure of the cable backplane system 100 and/or each other to form a cable rack 112 (shown in FIG. 2). Each of the cable assemblies 106 includes a tray 114 (shown in FIG. 2) forming part of the cable rack 112. The flexible wire harnesses 108 may extend from the trays 114 to other locations within the cable rack 112. The trays 114 may be box-shaped and define raceways for the cables. The cable rack 112 supports a plurality of the cable tray connectors 116 which form parts of the cable assemblies 106.

Figure 3:
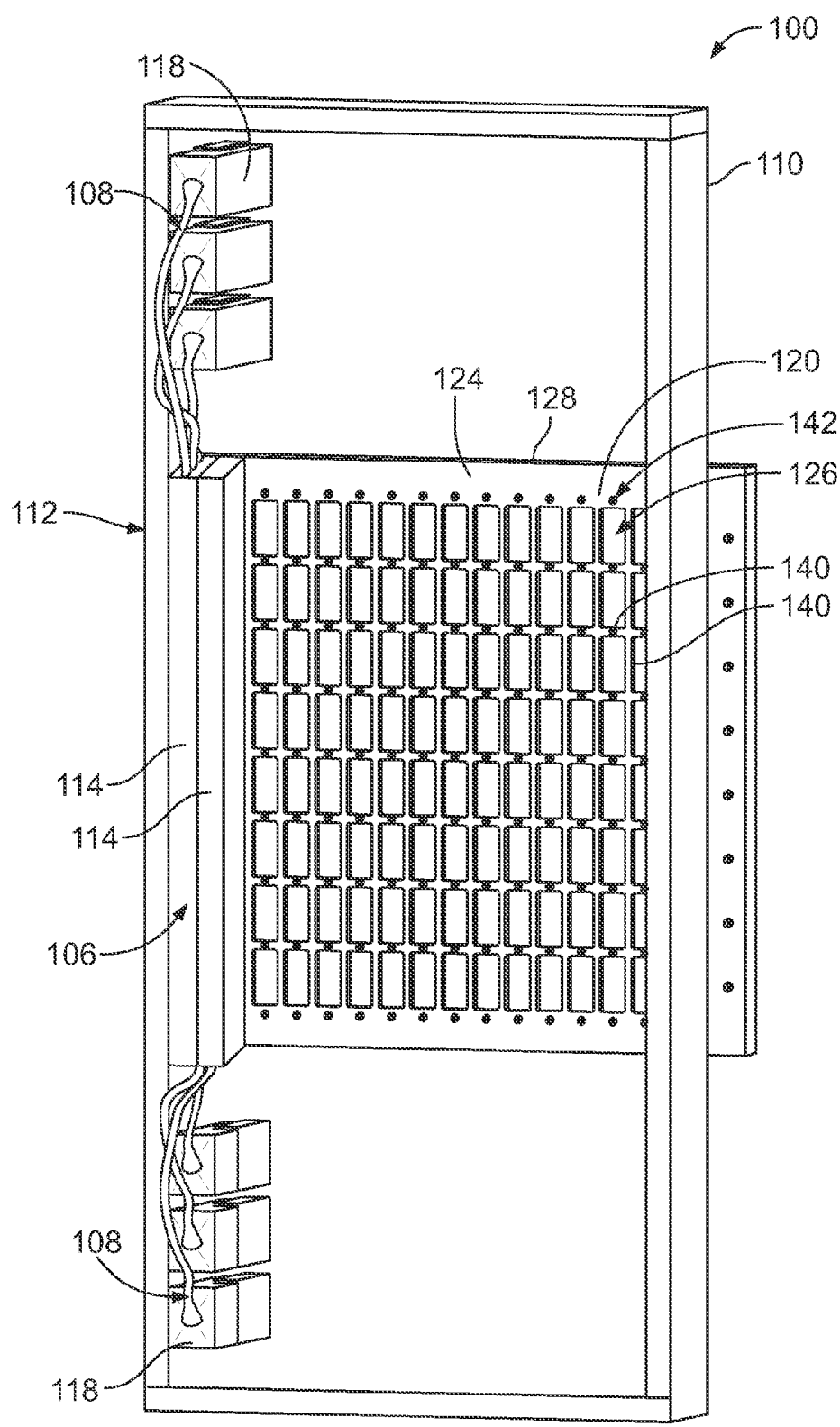
FIG. 3 illustrates a portion of the cable backplane system.

The cable backplane system 100 includes a backplane 120 (shown in FIG. 3). The backplane 120 may be a circuit board and may be manufactured from typical circuit board material, such as FR-4 material. Electrical components, such as power supplies, fans, connectors, and the like may be attached to the backplane 120. Such electrical components may be electrically connected to traces or circuits of the backplane 120. The cable tray connectors 116 are not electrically connected to the backplane 120, as is typical of conventional backplanes, but rather the cable tray connectors 116 are interconnected by cables extending between the cable tray connectors 116. The backplane 120 may be manufactured from other materials in alternative embodiments, such as another dielectric material or a metal material, such as a metal sheet, such as when no electrical routing on the backplane 120 is required. The trays 114, cable tray connectors 116 and/or cable harnesses 108 may be coupled to the backplane 120 and positioned with respect to the backplane 120 for mating with the line card 102 and/or switch card 104.

FIG. 3 illustrates the cable backplane system 100 with many of the cable assemblies 106 removed for clarity, only showing a couple of the cable assemblies 106 mounted to the chassis 110 and backplane 120. The cable assemblies 106 are coupled to the backplane 120 to form the cable backplane system 100. The cable assemblies 106 are provided along a rear side 124 of the backplane 120. The cable tray connectors 116 (FIG. 1) extend through openings 126 in the backplane 120 and are presented at a front side 128 of the backplane 120 for mating with the line and switch cards 102, 104 (both shown in FIG. 1). In an exemplary embodiment, the cable tray connectors 116 are held in precise locations for mating with the line cards 102 and/or switch cards 104. The trays 114 include features that align and position the cable tray connectors 116 with respect to the backplane 120.

In an exemplary embodiment, the walls of the trays 114 may be bent or moved to allow the cable tray connectors 116 to align with and pass through the openings 126. Optionally, portions of the trays 114 and/or the cable tray connectors 116 may pass through the openings 126. The trays 114 may float relative to each other and with respect to the backplane 120 to properly align the cable tray connectors 116 with the corresponding openings 126. Once the trays 114 are coupled to the backplane 120, the backplane 120 may be used to hold the cable tray connectors 116 in precise locations for mating with the line and switch cards 102, 104. For example, the openings 126 may be used to control the final position of the cable tray connectors 116 for mating. In an exemplary embodiment, the cable tray connectors 116 float relative to one another and relative to the trays 114 to allow precise positioning of the cable tray connectors 116 relative to the backplane 120 for mating with the line and switch cards 102, 104. The cable tray connectors 116 need to be precisely positioned relative to the backplane 120 for mating with corresponding card connectors 132, 134 (shown in FIG. 1).

A plurality of the openings 126 are visible in FIG. 3. Each opening is sized and shaped to receive a single cable tray connector 116 (shown in FIG. 1) therein; however the openings 126 may be sized to receive multiple cable tray connectors 116 therein in alternative embodiments. Optionally, the backplane 120 may have openings that are sized and shaped to receive the harness connectors 118.

The backplane 120 includes crossbars 140 between adjacent openings 126. The crossbars 140 provide support for the backplane 120. The crossbars 140 define mounting locations of the backplane 120 for securing the cable assemblies 106 and/or the cable rack 112 to the backplane 120. Optionally, the crossbars 140 may provide a mounting location for mounting blocks or bars (not shown), which may be metal blocks that extend across the front of the backplane 120 to stiffen the backplane 120. In an exemplary embodiment, the backplane 120 includes guide holes 142 through the crossbars 140 that are used for guidance or alignment of the cable assemblies 106 and/or the cable rack 112 during assembly. The guide holes 142 receive guide features, fasteners or other components used to assemble the cable backplane system 100.

Figure 4:
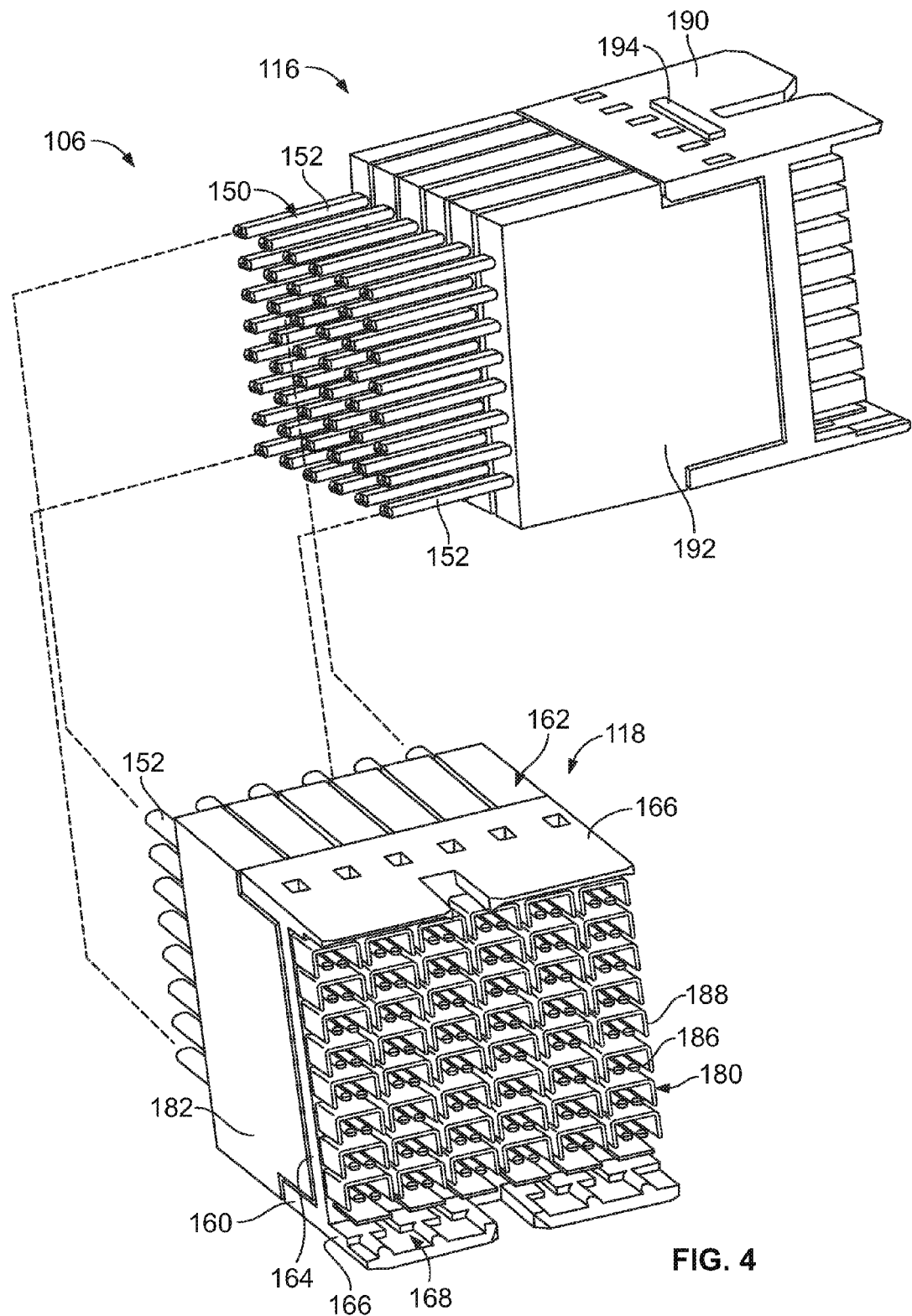
FIG. 4 illustrates a portion of a cable assembly of the cable backplane system.

FIG. 4 illustrates a portion of the cable assembly 106 showing one of the cable tray connectors 116 and one of the harness connectors 118 with a cable bundle 150 therebetween. The cable tray connectors 116 and harness connectors 118 are provided at opposite ends of the cable bundle 150. The cable bundle 150 includes a plurality of cables 152. While each of the cables 152 is shown extending between one cable tray connector 116 and one harness connector 118, it is possible that cables may extend from one cable tray connector 116 to more than one harness connector 118 and/or cables may extend from one harness connector 118 to more than one cable tray connector 116. Optionally, the cable tray connector 116 may be configured to be connected to a card connector 132 (shown in FIG. 1) of a line card 102 (shown in FIG. 1) and the harness connector 118 may be connected to a card connector 134 (shown in FIG. 1) of the switch card 104 (shown in FIG. 1).

The cable tray connectors 116 may define header connectors configured to be mated with corresponding card connectors, which may be receptacle connectors, such as STRADA Whisper receptacle connectors, commercially available from TE Connectivity, Harrisburg, Pa. The harness connectors 118 may define header connectors configured to be mated with corresponding card connectors, which may be receptacle connectors, such as STRADA Whisper receptacle connectors, commercially available from TE Connectivity, Harrisburg, Pa. In an exemplary embodiment, the connectors 116, 118 are high speed differential pair connectors that each includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable tray connector 116 each carrying a single signal conductor therein.

The harness connector 118 includes a header housing 160 holding a plurality of contact modules 162. The header housing 160 includes a base wall 164 and shroud walls 166 extending from the base wall 164 to define a mating cavity 168 configured to receive the corresponding card connector 132 or 134. The shroud walls 166 guide mating of the card connector 132 or 134 with the harness connector 118.

Each of the contact modules 162 includes a plurality of cable assemblies 180 held by a support body 182. Each cable assembly 180 includes a pair of signal contacts 186 terminated to corresponding signals wires of the cable 152. The signal contacts 186 of the harness connector 118 may be referred to as harness contacts 186. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield 188 to electrically common the ground shields 188, and a dielectric overmold overmolded around the cables 152 and portions of the metal plate to support the cables 152 and cable assemblies 180.

Multiple contact modules 162 are loaded into the header housing 160. The header housing 160 holds the contact modules 162 in parallel such that the cable assemblies 180 are aligned in a column or in a row. Any number of contact modules 162 may be held by the header housing 160 depending on the particular application.

The cable tray connector 116 may be similar to the harness connector 118. The cable tray connector 116 includes a header housing 190 holding a plurality of contact modules 192. The contact modules 192 may be similar to the contact modules 162; however the contact modules 192 may be a different size and may include a different number of signal contacts. In an exemplary embodiment, the header housing 190 has lugs 194 extending outward therefrom. The lugs 194 are used to locate the cable tray connector 116 with respect to the corresponding tray 114 (shown in FIG. 2).

Figure 5:
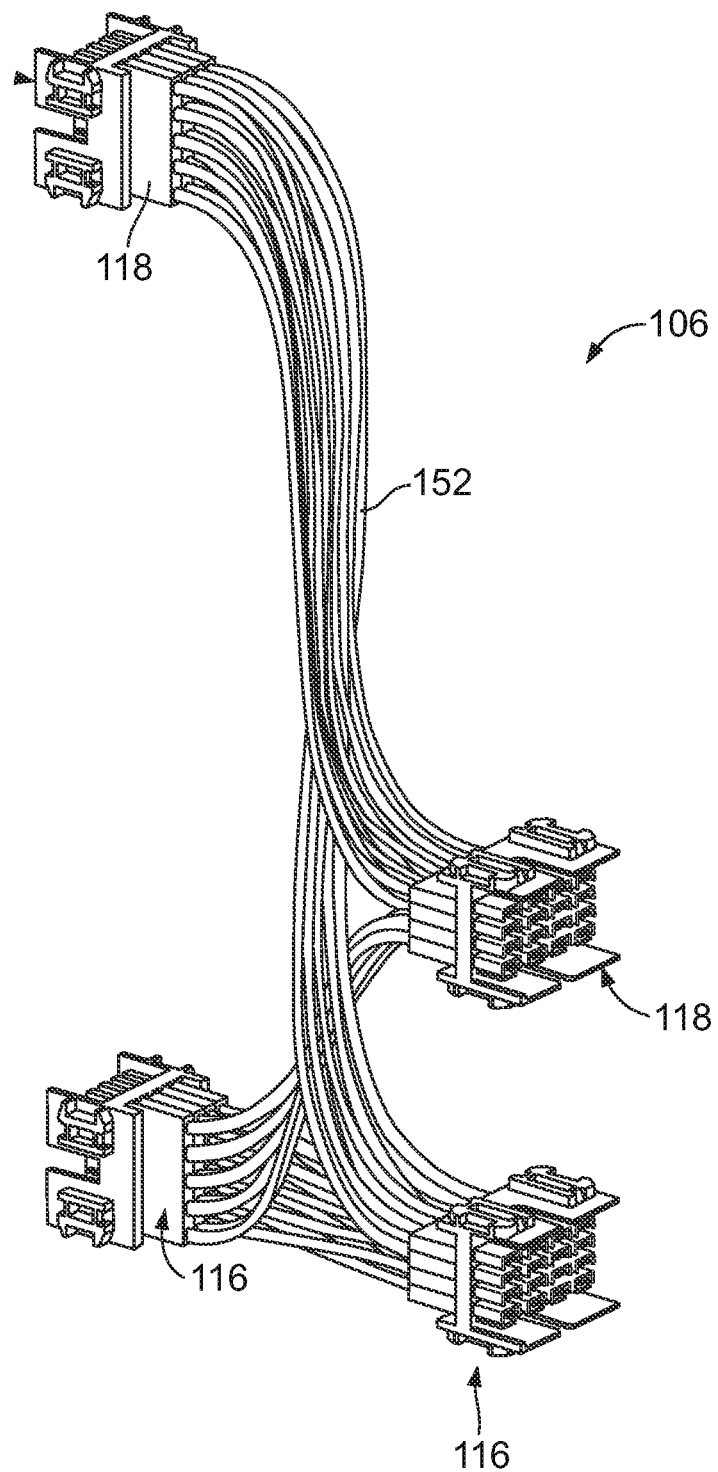
FIG. 5 illustrates a portion of the cable assembly.

FIG. 5 illustrates a portion of the cable assembly 106 showing a plurality of the cable tray connectors 116 connected to a plurality of the harness connectors 118. Some of the cables 152 from the same cable tray connector 116 are routed to different harness connectors 118 and some of the cables 152 from the same harness connector 118 are routed to different cable tray connectors 116. Any number of cable tray and harness connectors 116, 118 may be used in alternative embodiments. For example, one exemplary embodiment may include three harness connectors 118 interconnected to eight different cable tray connectors 116. The harness connectors 118 may hold a different number of signal contacts than the cable tray connectors 116. For example, the harness connectors 118 may be 16×8 connectors having sixteen pairs of signal contacts in each row and eight pairs of signal contacts in each column, whereas the cable tray connectors 116 may be 6×8 connectors having six pairs of signal contacts in each row and eight pairs of signal contacts in each column. Other combinations are possible in alternative embodiments.

Figure 6:
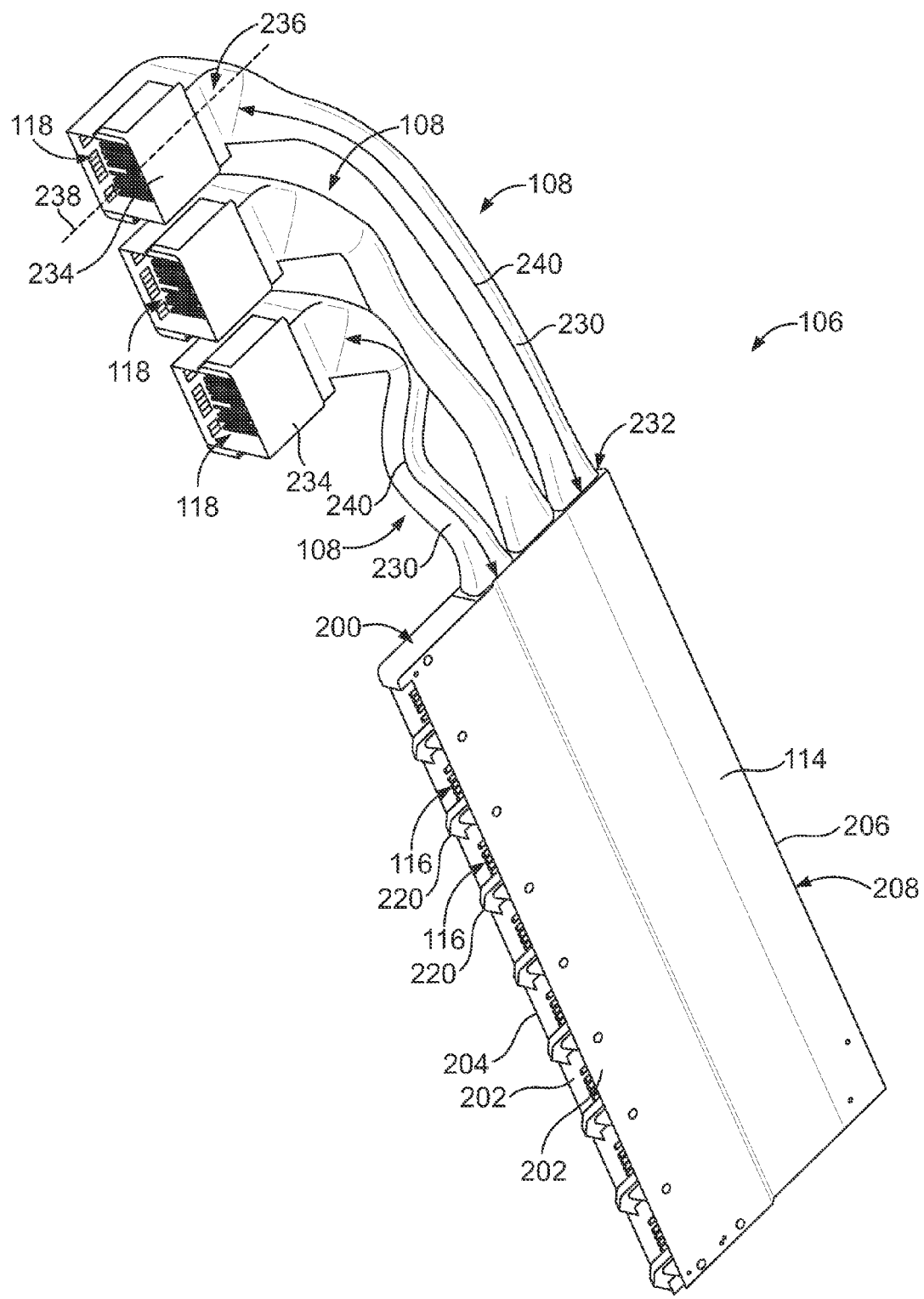
FIG. 6 is a perspective view of the cable assembly formed in accordance with an exemplary embodiment.
Figure 7:
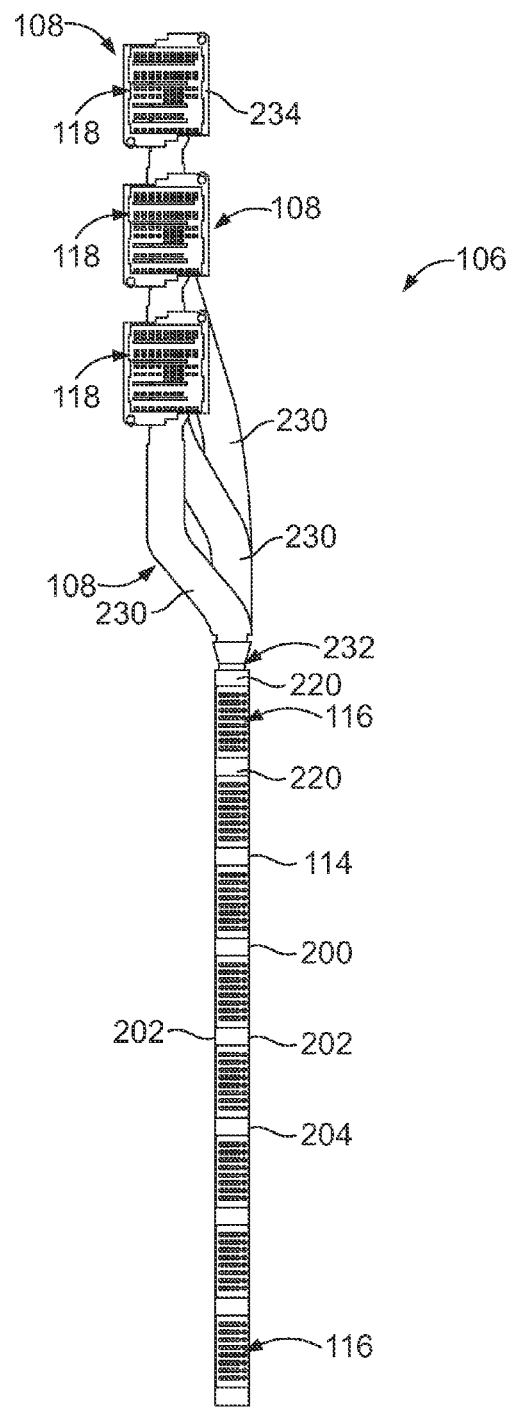
FIG. 7 is a front view of the cable assembly.

FIG. 6 is a perspective view of one of the cable assemblies 106 formed in accordance with an exemplary embodiment. FIG. 7 is a front view of the cable assembly 106. The cable assembly 106 includes a plurality of the cable tray connectors 116 held within the tray 114 and a plurality of the flexible cable harnesses 108 extending from the tray 114. The tray 114 includes a frame 200 surrounding a raceway through which the cables 152 (shown in FIG. 4) are routed between the cable tray connectors 116 and the harness connectors 118. The frame 200 includes side walls 202 extending between a front edge 204 and a rear 206 of the frame 200. A back wall 208 covers the raceway at the rear 206. The frame 200 is open at the front edge 204 between the side walls 202 to receive the cable tray connectors 116 therein.

In an exemplary embodiment, the side walls 202 and back wall 208 are sheet metal pieces that are stamped, formed and coupled together, such as using fasteners or other connecting means. The sheet metal may be thin enough to allow the frame 200 to have some flexibility for moving, twisting or otherwise manipulating the trays 114 into position relative to the backplane 120 (shown in FIG. 3) to position the cable tray connectors 116 in the openings 126 (shown in FIG. 3) in the backplane 120. The trays 114 hold the cable tray connectors 116 in generally fixed positions relative to one another, such as at a predefined spacing, such that the cable tray connectors 116 may be loaded into the openings 126. Even with the cable tray connectors 116 being held in generally fixed positions relative to one another, the cable tray connectors 116 may have a predetermined limited range of float relative to the tray 114 to allow the cable tray connectors 116 to be precisely positioned within the openings 126.

The tray 114 includes a plurality of spacer assemblies 220 used to hold positions of the cable tray connectors 116. The spacer assemblies 220 function to support one or more cable tray connectors 116 within the frame 200. The spacer assemblies 220 align and position the cable tray connectors 116 with respect to the backplane 120. The spacer assemblies 220 are configured to be coupled to the backplane 120 (shown in FIG. 3) or a mounting block on the backplane 120 to secure the spacer assemblies 220 in position relative to the backplane 120, such as using fasteners such as screws.

In the illustrated embodiment, three flexible cable harnesses 108 extend from the tray 114, however any number of flexible cable harnesses 108 may be provided in alternative embodiments. The flexible cable harnesses 108 are independently movable relative to one another and relative to the tray 114. As such, the harness connectors 118 are variably positionable relative to the tray 114. The harness connectors 118 may be positioned in-line or in a common plane with the tray 114 and cable tray connectors 116, or alternatively may be positioned out of plane relative to the tray 114 and cable tray connectors 116.

The flexible cable harness 108 includes a flexible shield 230 providing electrical shielding for the cables 152 (shown in FIG. 4) extending between the harness connector 118 and the tray 114. The flexible shield 230 may be a cable braid, a metallic jacket, a metallic wrap or any other form of flexible shielding structure capable of surrounding the cables 152. In an exemplary embodiment, the flexible shield 230 closely surrounds the cables 152 so as to reduce the amount of space occupied by the flexible cable harness 108 within the cable backplane system 100 (shown in FIG. 1). The flexible shield 230 entirely surrounds the cables 152 from the tray 114 to the harness connector 118 to provide electrical shielding along the entire length of each cable contained therein. The flexible shield 230 provides electromagnetic interference (EMI) protection (or other interference protection) for the cable assembly 106. The flexible shield 230 may be an absorber that is capable of absorbing EMI or other types of electrical interference.

In an exemplary embodiment, the flexible shield 230 is electrically connected to the tray 114 to provide continuity in shielding along the entire lengths of the cables 152. The flexible shield 230 may be terminated to an exterior of the tray 114, such as at a cable exit 232 of the tray 114 where the cables 152 exit from the raceway. Alternatively, the flexible shield 230 may be terminated to an interior of the tray 114 or to another component or structure electrically connected to the tray 114. The flexible shield 230 may also be electrically connected to a shell 234 surrounding the harness connector 118. The shell 234 may be a metal cover surrounding the harness connector 118 to provide electrical shielding for the harness connector 118. Optionally, the shell 234 may have a cable exit 236 that is angled relative to a central axis 238 of the harness connector 118. For example, the cable exit 236 may be angled at approximately 45° relative to the central axis 238 to direct the cables 152 away from the harness connector 118. The cable exit 236 may control the bend angle of the cables 152 to prevent damage to the cables 152.

In an exemplary embodiment, the flexible cable harnesses 108 may have different lengths 240. For example, the flexible shields 230 may have different lengths allowing the harness connectors 118 to be positioned at different distances from the tray 114. While all of the flexible cable harnesses 108 are illustrated as extending from the same side of the tray 114, it is possible to have the flexible cable harnesses 108 extend from different sides of the tray 114 and/or from the back of the tray 114.

With reference back to FIG. 3, when the cable assemblies 106 are arranged in the chassis 110, adjacent cable assemblies 106 are inverted such that the flexible cable harnesses 108 extend in different directions. All of the trays 114 are arranged in the middle section of the chassis 110 with some of the flexible cable harnesses 108 above the trays 114 and some of the flexible cable harnesses 108 below the trays 114. Such an arrangement allows for tight packing of the cable assemblies 106 in the chassis 110 even though the harness connectors 118 (shown in FIG. 6) and cable tray connectors 116 (shown in FIG. 6) have different widths. Other configurations are possible in alternative embodiments. For example, the trays 114 may be arranged horizontally with the flexible cable harnesses 108 extending vertically above and/or below the trays 114. For example, the cable assemblies may have an H-configuration with the trays 114 in the middle and legs of the flexible cable harnesses 108 extending both upward and downward from both ends of the section of trays 114. Other configurations are possible in alternative embodiments.

Figure 8:
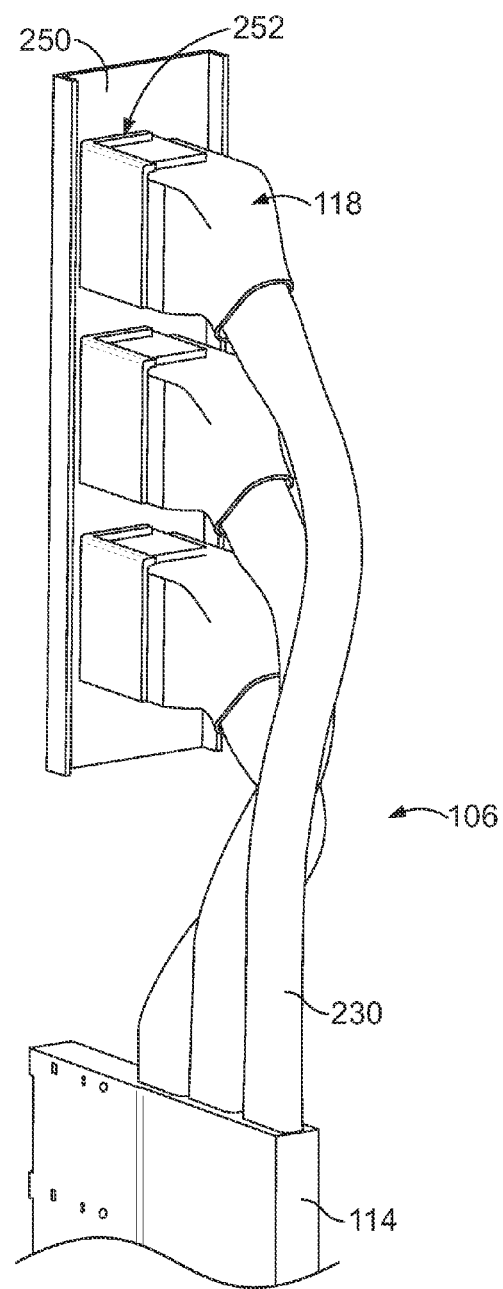
FIG. 8 illustrates a portion of the cable assembly with harness connectors thereof coupled to a front panel.

FIG. 8 illustrates a portion of the cable assembly 106 with the harness connectors 118 coupled to a front panel 250. The front panel 250 includes a plurality of openings 252 that receive corresponding harness connectors 118. The front panel 250 fixes the positions of the harness connectors 118 relative to one another, however the panel and harness connectors 118 are movable or variably positionable, as a unit, with respect to the tray 114. The flexible shields 230 and cables 152 (shown in FIG. 4) within the flexible shields 230 are flexible and allow relative movement between the harness connectors 118 and the tray 114.

Embodiments described herein provide cable assemblies having flexible cable harnesses to form flexible sections that allow ease of use for the installer. The flexible cable harnesses allow different configurations or placement of components of the cable backplane system. Harness connectors of the flexible cable harnesses are independently movable relative to one another and relative to the cable tray. The flexible cable harnesses allow a particular cable assembly design to fit in different types of systems or architectures, such as to fit different customer needs. The flexible cable harnesses allow more space to implement other features or components within the cable backplane system, such as power modules, system airflow components, such as fans, and the like.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A cable assembly for a cable backplane system, the cable assembly comprising:
   a tray having a frame surrounding a raceway and spacer assemblies coupled to the frame, the spacer assemblies holding cable tray connectors in fixed positions relative to the frame, each of the cable tray connectors having a housing holding a plurality of contacts, each of the cable tray connectors having cables terminated to corresponding contacts and extending rearward from the corresponding housing into the raceway, the housings being configured to be received in corresponding openings in a backplane of the cable backplane system; and
   a flexible cable harness extending from the tray, the flexible cable harness having a flexible shield electrically coupled to the frame, the flexible cable harness having a harness connector, the harness connector being electrically connected to at least one corresponding cable tray connector, wherein at least some of the cables are routed from the raceway through the flexible shield to the harness connector, the flexible shield providing electrical shielding for the cables, the harness connector being variably positionable relative to the tray.

2. The cable assembly of claim 1, wherein the harness connector is electrically connected to the cables and the contacts of the at least two cable tray connectors.

3. The cable assembly of claim 1, wherein the harness connector is electrically connected to the cables and the contacts of each of the cable tray connectors.

4. The cable assembly of claim 1, wherein the flexible shield entirely surrounds the cables from the tray to the harness connector to provide electrical shielding along entire lengths of the respective cables.

5. The cable assembly of claim 1, wherein the harness connector comprises a shell electrically coupled to the flexible shield to provide electrical shielding around the harness connector.

6. The cable assembly of claim 1, wherein the harness connector comprises a plurality of harness contacts terminated to the corresponding cables.

7. The cable assembly of claim 1, wherein the frame includes side walls and a back wall defining a box-shaped raceway, the spacer assemblies extending between the side walls to hold the cable tray connectors at a front edge of the tray for loading into corresponding openings in the backplane.

8. The cable assembly of claim 1, wherein the flexible cable harness comprises a first flexible cable harness, the cable assembly further comprising a second flexible cable harness extending from the tray, the second flexible cable harness having a flexible shield electrically coupled to the frame, the second flexible cable harness having a second harness connector, the second flexible cable harness being independently movable relative to the first flexible cable harness.

9. The cable assembly of claim 8, wherein the flexible shields of the first and second flexible cable harnesses have different lengths to position the harness connectors of the first and second flexible cable harnesses at different distances from the tray.

10. The cable assembly of claim 8, further comprising a front panel having a plurality of openings, the harness connectors of the first and second flexible cable harnesses being received in different openings in the panel and being fixed in position relative to one another by the front panel, the front panel being variably positionable relative to the tray.

11. The cable assembly of claim 1, wherein the harness connector is configured to be coupled to a line card connector and the cable tray connectors are configured to be connected to switch card connectors of a switch card.

12. A cable backplane system comprising:
   a backplane having a plurality of openings therethrough; and
   a cable rack coupled to a rear side of the backplane, the cable rack including a plurality of cable assemblies, each of the cable assembly comprising:
   a tray having a frame surrounding a raceway, the tray holding cable tray connectors in fixed locations relative to one another, each of the cable tray connectors having a plurality of cables extending therefrom, the cables being routed in the raceway, the cable tray connectors being received in corresponding openings in the backplane; and
   a flexible cable harness extending from the tray, the flexible cable harness having a harness connector being variably positionable relative to the tray, the harness connector being electrically connected to the cables extending from corresponding the cable tray connectors.

13. The cable backplane system of claim 12, wherein the harness connector is electrically connected to the cables and the contacts of the at least two cable tray connectors.

14. The cable backplane system of claim 12, wherein the flexible cable harness comprises a flexible shield surrounding the cables from the tray to the harness connector to provide electrical shielding along entire lengths of the respective cables.

15. The cable backplane system of claim 14, wherein the harness connector comprises a shell electrically coupled to the flexible shield to provide electrical shielding around the harness connector.

16. The cable backplane system of claim 12, wherein the flexible cable harness comprises a first flexible cable harness, the cable assembly further comprising a second flexible cable harness extending from the tray, the second flexible cable harness having a second harness connector, the second flexible cable harness being independently movable relative to the first flexible cable harness.

17. The cable backplane system of claim 16, wherein the first and second flexible cable harnesses each comprise flexible shields extending between the tray and the corresponding harness connectors, the flexible shields having different lengths to position the harness connectors of the first and second flexible cable harnesses at different distances from the tray.

18. The cable backplane system of claim 12, further comprising a front panel having a plurality of openings, the harness connectors of the first and second flexible cable harnesses being received in the different openings in the front panel and being fixed in position relative to one another by the front panel, the front panel being variably positionable relative to the tray.

19. A cable backplane system comprising:
a backplane having a plurality of openings therethrough; and
a cable rack coupled to a rear side of the backplane, the cable rack including a plurality of cable assemblies, each of the cable assembly comprising:
a tray having a frame surrounding a raceway, the tray holding spacer assemblies with cable tray connectors held by the corresponding spacer assemblies, each of the cable tray connectors having a plurality of cables extending therefrom, the cables being routed in the raceway, the cable tray connectors being received in the corresponding openings in the backplane; and
a flexible cable harness extending from the tray, the flexible cable harness having a flexible shield electrically coupled to the frame, the flexible cable harness having a harness connector, wherein the cables are routed from the raceway through the flexible shield to the harness connector, the flexible shield providing electrical shielding for the cables, the harness connector being variably positionable relative to the tray.

20. The cable backplane system of claim 19, wherein the flexible cable harness comprises a first flexible cable harness, the cable assembly further comprising a second flexible cable harness extending from the tray, the second flexible cable harness having a flexible shield electrically coupled to the frame, the second flexible cable harness having a second harness connector, the second flexible cable harness being independently movable relative to the first flexible cable harness.

* * * * *